US012601756B2

(12) United States Patent
Hsiao et al.

(10) Patent No.: US 12,601,756 B2
(45) Date of Patent: Apr. 14, 2026

(54) MATCHING METHOD FOR SEMICONDUCTOR TOPOGRAPHY MEASUREMENT AND PROCESSING DEVICE USING THE SAME

(71) Applicant: UNITED MICROELECTRONICS CORP., Hsinchu (TW)

(72) Inventors: Po-Jen Hsiao, New Taipei City (TW);
Ya-Ching Cheng, Hsinchu City (TW);
Chih-Yueh Li, Taipei City (TW);
Yu-Ying Hu, Tainan City (TW);
Da-Ching Liao, Taichung City (TW);
Zih-Wun Peng, Tainan City (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 426 days.

(21) Appl. No.: 18/204,666

(22) Filed: Jun. 1, 2023

(65) Prior Publication Data

US 2024/0369594 A1      Nov. 7, 2024

(30) Foreign Application Priority Data

May 4, 2023   (TW) ................................. 112116606

(51) Int. Cl.
*G01Q 30/04* (2010.01)
*H10P 74/20* (2026.01)

(52) U.S. Cl.
CPC ........... *G01Q 30/04* (2013.01); *H10P 74/203* (2026.01)

(58) Field of Classification Search
CPC ............................... H01L 22/12; G01Q 30/04
USPC ......................................................... 702/167
See application file for complete search history.

(56) References Cited

U.S. PATENT DOCUMENTS

| | | | | |
|---|---|---|---|---|
| 8,755,045 | B2 | 6/2014 | Lin | |
| 10,557,803 | B2 * | 2/2020 | Lynch ................ | G01B 11/0608 |
| 11,422,096 | B2 * | 8/2022 | Li ............................ | G03F 1/24 |

* cited by examiner

*Primary Examiner* — John H Le
(74) *Attorney, Agent, or Firm* — WPAT, PC

(57) ABSTRACT

A matching method for semiconductor topography measurement and a processing device using the same are provided. The matching method includes the following steps. An original surface topography curve is obtained. The original surface topography curve is obtained by measuring along a measurement straight line path of a semiconductor device. The original surface topography curve is converted into a surface topography variation curve. A circuit layout is obtained. A plurality of conductor density variation curves are obtained along a plurality of layout straight-line paths. According to a plurality of weighted values of a plurality of topography variation observation intervals of the surface topography variation curve, a weighted correlation between the surface topography variation curve and each of the conductor density variation curves is analyzed. According to the weighted correlations, the measurement straight line path matching the original surface topography curve is obtained from the layout straight-line paths.

20 Claims, 10 Drawing Sheets

100

CV1 LY1,PH1i

Receiving unit 110

Surface topography pretreatment element 121

Surface topography transformation element 122

Surface topography variation analysis unit 120

Conductor density analysis element 141

Weighted correlation analysis unit 150

Dividing element 151

Conductor density conversion element 142

Conductor density variation analysis unit 140

Weight analysis element 152

Correlation analysis element 154

Weighting element 155

Fitting unit 160

CV1 PH1i CV2 CV3 CV5i CV4i SBk SBk DBk RSik Wk RSi PH1*

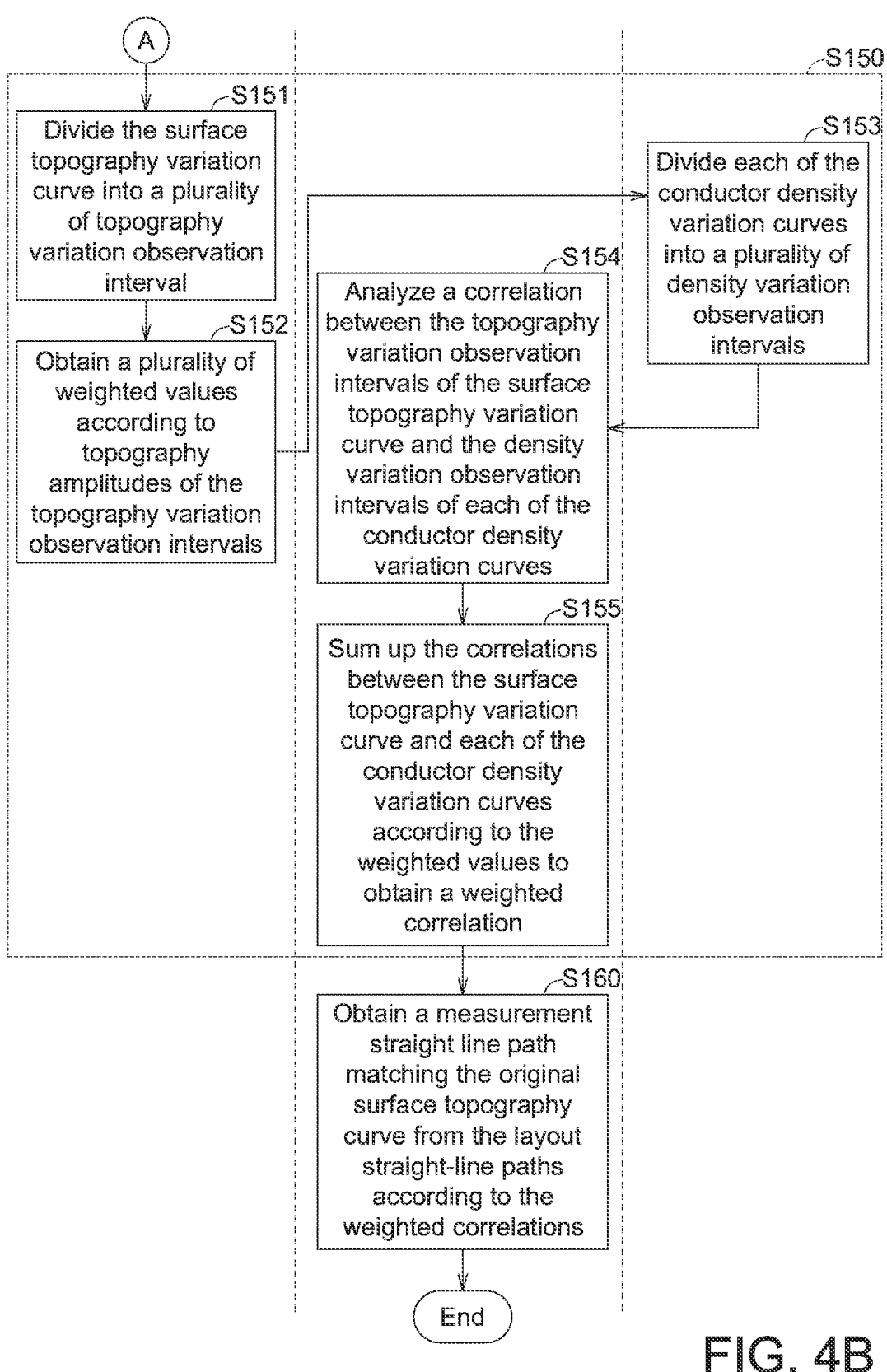

A

S150

S151
Divide the surface topography variation curve into a plurality of topography variation observation interval S153
Divide each of the conductor density variation curves into a plurality of density variation observation intervals S152
Obtain a plurality of weighted values according to topography amplitudes of the topography variation observation intervals S154
Analyze a correlation between the topography variation observation intervals of the surface topography variation curve and the density variation observation intervals of each of the conductor density variation curves S155
Sum up the correlations between the surface topography variation curve and each of the conductor density variation curves according to the weighted values to obtain a weighted correlation S160
Obtain a measurement straight line path matching the original surface topography curve from the layout straight-line paths according to the weighted correlations End

FIG. 4B

MATCHING METHOD FOR SEMICONDUCTOR TOPOGRAPHY MEASUREMENT AND PROCESSING DEVICE USING THE SAME

This application claims the benefit of Taiwan application Serial No. 112116606, filed May 4, 2023, the disclosure of which is incorporated by reference herein in its entirety.

TECHNICAL FIELD

The disclosure relates in general to processing method and an electric device using the same, and more particularly to a matching method for semiconductor topography measurement and a processing device using the same.

BACKGROUND

With the development of semiconductor technology, several kinds of complex semiconductor devices are constantly being introduced. In the semiconductor manufacturing process, it is necessary to measure the surface topography of the semiconductor device. The surface topography measurement of the semiconductor device can be used to confirm the accuracy of circuit patterning. Alternatively, the surface topography measurement of the semiconductor device can also be used to train a product yield prediction model or a defect prediction model.

However, whether it is to confirm the accuracy of circuit patterning or to perform model training, it is necessary to accurately match the location of the surface topography measurement to the location of the circuit layout.

SUMMARY

The disclosure is directed to a matching method for semiconductor topography measurement and a processing device using the same. An original surface topography curve of the semiconductor topography measurement and several layout straight-line paths on a circuit layout are properly processed, so that the original surface topography curve can be matched with a measurement straight line path from the layout straight-line paths. It does not need to spend too much time for correction, and can be used to confirm the accuracy of circuit patterning or to train a product yield prediction model and a defect prediction model.

According to one embodiment, a matching method for semiconductor topography measurement is provided. The matching method for semiconductor topography measurement includes the following steps. An original surface topography curve is obtained. The original surface topography curve is obtained by measuring along a measurement straight line path of a semiconductor device. The original surface topography curve is converted into a surface topography variation curve. A circuit layout of the semiconductor device is obtained. A plurality of conductor density variation curves are obtained along a plurality of layout straight-line paths on the circuit layout. A weighted correlation between the surface topography variation curve and each of the conductor density variation curves are analyzed according to a plurality of weighted values of a plurality of topography variation observation intervals of the surface topography variation curve. The measurement straight line path matching the original surface topography curve is obtained from the layout straight-line paths according to the weighted correlations.

According to another embodiment, a processing device is provided. The processing device includes a receiving unit, a surface topography variation analysis unit, a conductor density variation analysis unit, a weighted correlation analysis unit and a fitting unit. The receiving unit is configured to receive an original surface topography curve and a circuit layout of a semiconductor device. The original surface topography curve is obtained by measuring along a measurement straight line path of a semiconductor device. The surface topography variation analysis unit is configured to convert the original surface topography curve into a surface topography variation curve. The conductor density variation analysis unit is configured to obtain a plurality of conductor density variation curves along a plurality of layout straight-line paths on the circuit layout. The weighted correlation analysis unit is configured to analyze a weighted correlation between the surface topography variation curve and each of the conductor density variation curves according to a plurality of weighted values of a plurality of topography variation observation intervals of the surface topography variation curve. The fitting unit is configured to obtain the measurement straight line path matching the original surface topography curve from the layout straight-line paths according to the weighted correlations.

BRIEF DESCRIPTION OF THE DRAWINGS

FIGS. 4A to 4B illustrate a flow chart of a matching method for the semiconductor topography measurement according to an embodiment.

Figure 1:
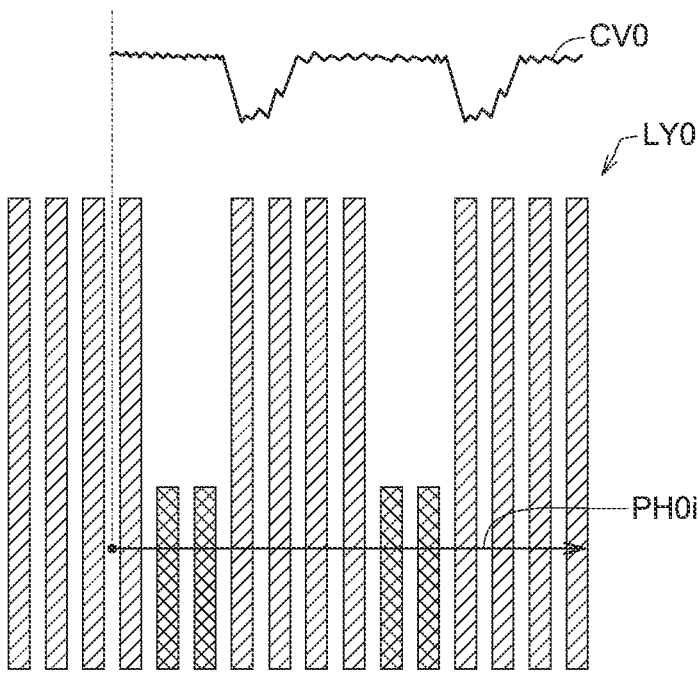
FIG. 1 shows a circuit layout and an original surface topography curve of a semiconductor device according to an embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Please refer to FIG. 1, which shows a circuit layout LY0 and an original surface topography curve CV0 of a semiconductor device according to an embodiment. The circuit layout LY0 is, for example, a two-dimensional layout diagram describing signal lines, dummy lines, and interlayer lines. The original surface topography curve CV0 is, for example, a measurement curve obtained through an Atomic Force Microscope (AFM). The Atomic Force Microscope may measure a certain layout straight-line path PH0$i$ on the circuit layout LY0 according to a predetermined setting. However, it can be seen from FIG. 1 that the layout straight-line path PH0*i* on the circuit layout LY0 cannot correspond to the fluctuation of the original surface topography curve CV0, so the layout straight-line path PH0*i* is not a measurement straight line path PH0* (shown in FIG. 2) where the Atomic Force Microscope actually measures.

Figure 2:
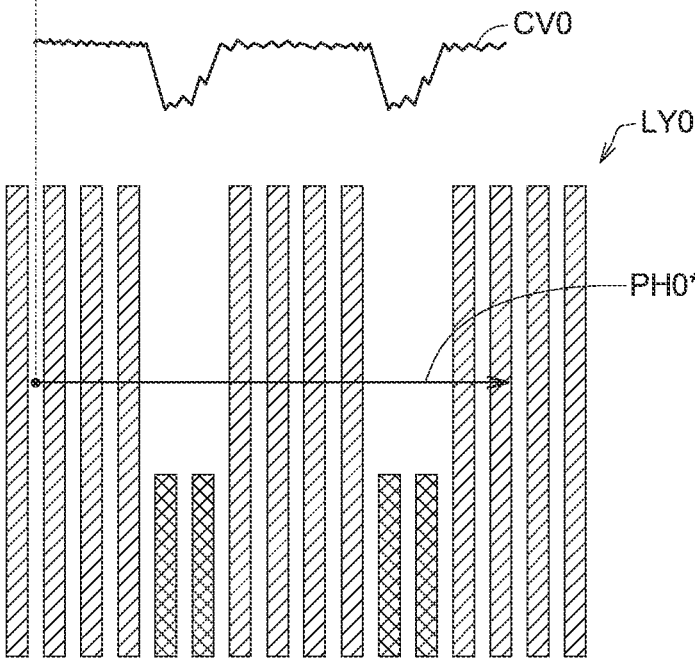
FIG. 2 shows a measurement straight line path actually measured by Atomic Force Microscope.

Please refer to FIG. 2, which shows the measurement straight line path PH0* actually measured by Atomic Force Microscope. Since the layout straight-line path PH0*i* in FIG. 1 is not the measurement straight line path PH0* actually measured by the Atomic Force Microscope, it takes a considerable amount of time to perform corrections to find out the measurement straight line path PH0* in FIG. 2. The pattern of the measurement straight line path PH0* correctly corresponds to the fluctuation of the original surface topography curve CV0. After finding out the accurate measurement straight line path PH0*, the original surface topography curve CV0 can be used to confirm the accuracy of circuit patterning. Alternatively, the original surface topography curve CV0 can also be used to train the product yield prediction model or the defect prediction model. However, the circuit layout LY0 has infinitely many layout straight-line paths PH0*i*, how to find out the accurate measurement straight line path PH0* from the numerous layout straight-line paths PH0*i* is a very difficult action, which has become a bottleneck on the development of semiconductor technology.

Figure 3:
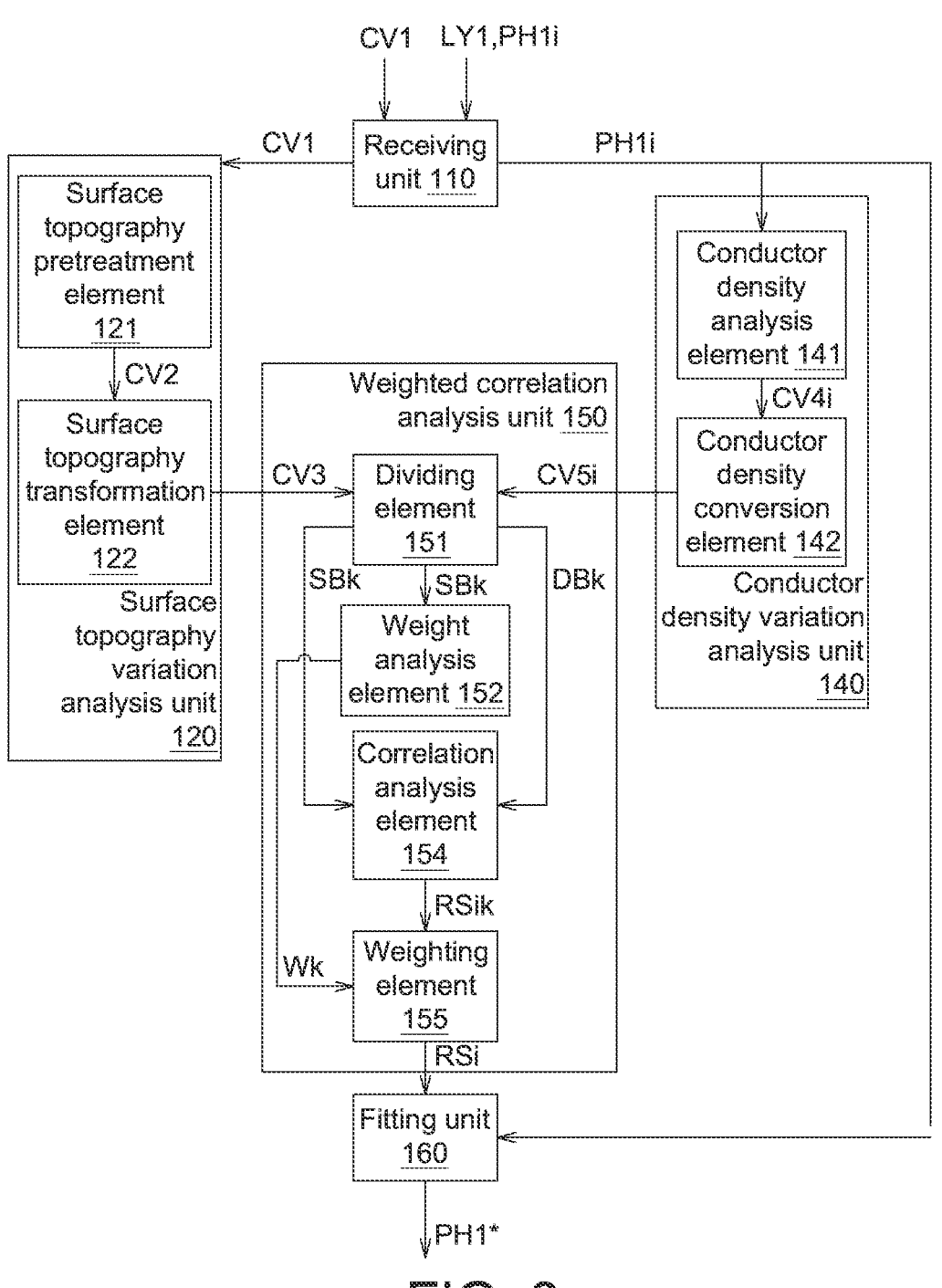
FIG. 3 shows a block diagram of a processing device according to an embodiment.

Please refer to FIG. 3, which shows a block diagram of a processing device 100 according to an embodiment. The processing device 100 is, for example, a server, a computer, a cloud computing center, a cluster computing center or a processor. In this embodiment, the accurate measurement straight line path PH1* can be found through the processing device 100. The processing device 100 includes a receiving unit 110, a surface topography variation analysis unit 120, a conductor density variation analysis unit 140, a weighted correlation analysis unit 150 and a fitting unit 160. The receiving unit 110 is used to receive various information. The receiving unit 110, is for example, a connection port, a network transmission module, a transmission line or a storage device. The surface topography variation analysis unit 120 is used for analyzing the surface topography. The surface topography variation analysis unit 120 includes a surface topography pretreatment element 121 and a surface topography transformation element 122. The conductor density variation analysis unit 140 is used for analyzing the circuit layout. The conductor density variation analysis unit 140 includes a conductor density analysis element 141 and a conductor density conversion element 142.

The weighted correlation analysis unit 150 is used for analyzing the correlation. The weighted correlation analysis unit 150 includes a dividing element 151, a weight analysis element 152, a correlation analysis element 154 and a weighting element 155. The fitting unit 160 is used for fitting the analysis results. The surface topography variation analysis unit 120, the conductor density variation analysis unit 140, the weighted correlation analysis unit 150 and/or the fitting unit 160 is, for example, a circuit, a chip, a circuit board, a computer program product or a storage device for storing program codes.

In this embodiment, after proper processing the original surface topography curve CV1 and the layout straight-line paths PH1*i*, the measurement straight line path PH1* matched to the original surface topography curve CV1 can be obtained from the layout straight-line paths PH1*i*. The operation of the above-mentioned elements is described in detail with a flow chart as below.

Figure 4A:
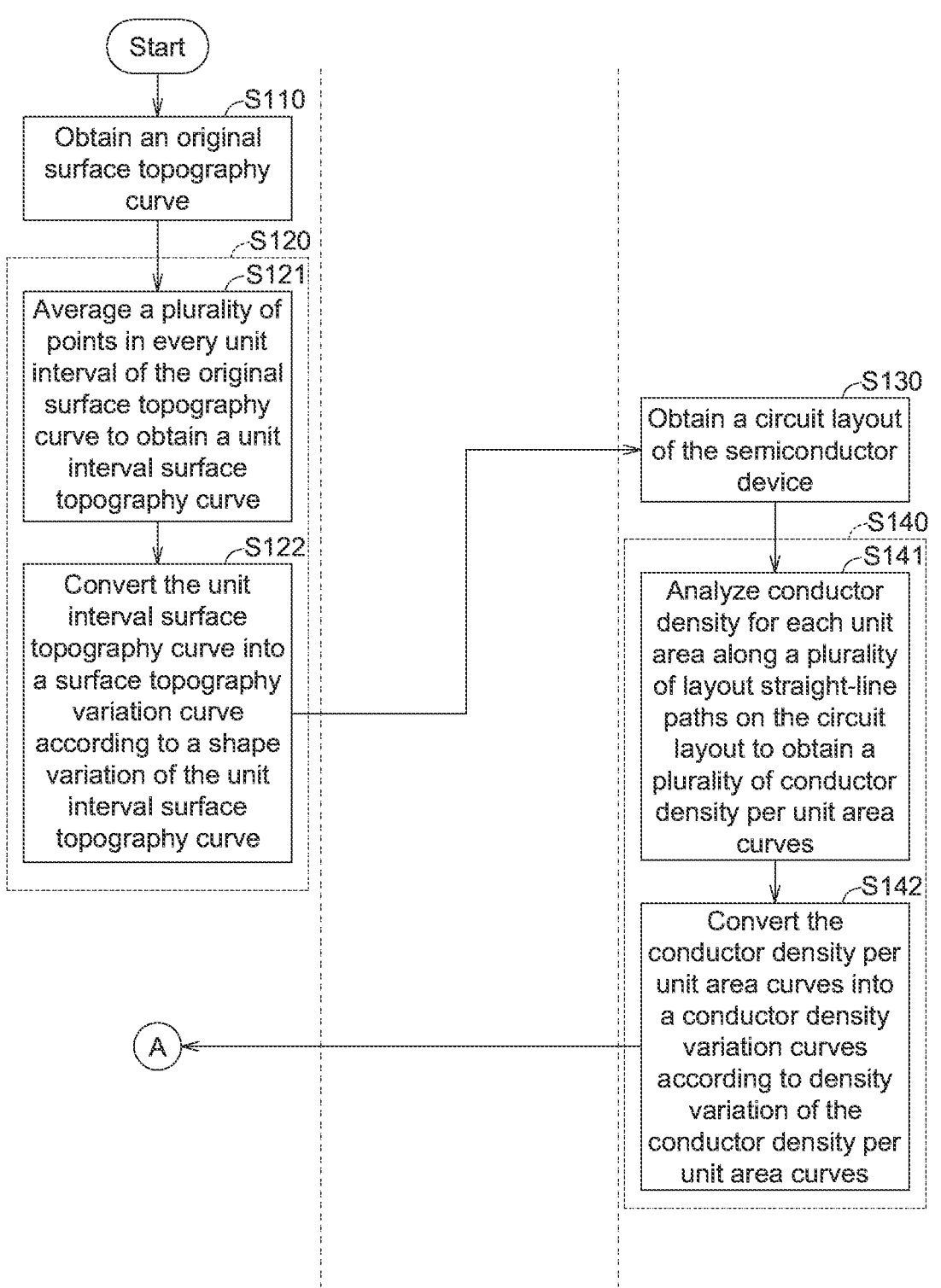
Figure 5:
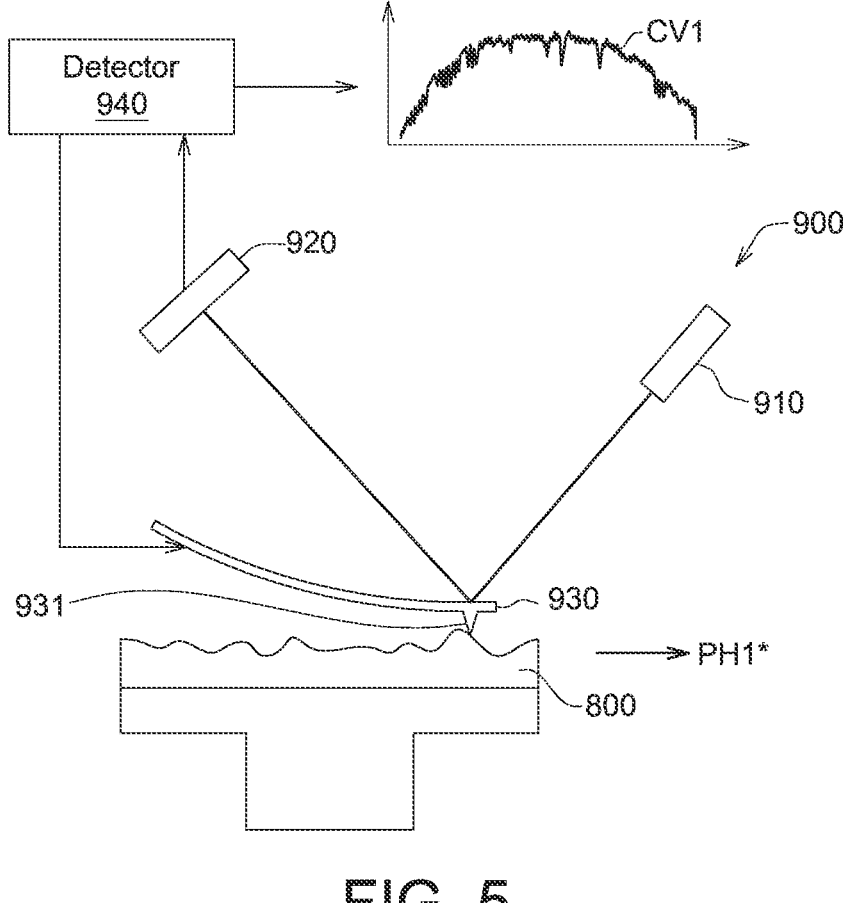
FIG. 5 illustrates the Atomic Force Microscope according to an embodiment.

Please refer to FIGS. 3 to 4B. FIGS. 4A to 4B illustrate a flow chart of a matching method for the semiconductor topography measurement according to an embodiment. In the step S110, as shown in FIG. 5, the receiving unit 110 obtains the original surface topography curve CV1. The original surface topography curve CV1 is measured, by the Atomic Force Microscope, along the measurement straight line path PH1* on the semiconductor device 800. In the case of equipment errors, it is difficult for the user to accurately know the location of the measurement straight line path PH1* actually measured by the Atomic Force Microscope.

Please refer to FIG. 5, which illustrates the Atomic Force Microscope 900 according to an embodiment. The Atomic Force Microscope 900 (AFM), also known as Scanning Force Microscope (SFM), is a nanoscale high-resolution scanning probe microscope, which is 1000 times better than the optical diffraction limit. As shown in FIG. 5, the Atomic Force Microscope 900 includes, for example, a laser emitter 910, a photodiode 920, a cantilever 930 and a detector 940. The size of the cantilever 930 is tens to hundreds of microns, usually made of silicon or silicon nitride, and the probe 931 is set on it. The radius of curvature of the probe tip is in nanometers. When the probe 931 is placed on the surface of the semiconductor device 800, the probe 931 on the cantilever 930 will bend and deflect according to Hooke's law due to the force on the surface of the sample.

When the laser beam projected on the cantilever 930 is reflected to the photodiode 920, the deviation degree of the probe 931 can be measured. When the Atomic Force Microscope 900 measures along the measurement straight line path PH1* of the semiconductor device 800, the offset change of the cantilever 930 forms the original surface topography curve CV1.

Figure 6:
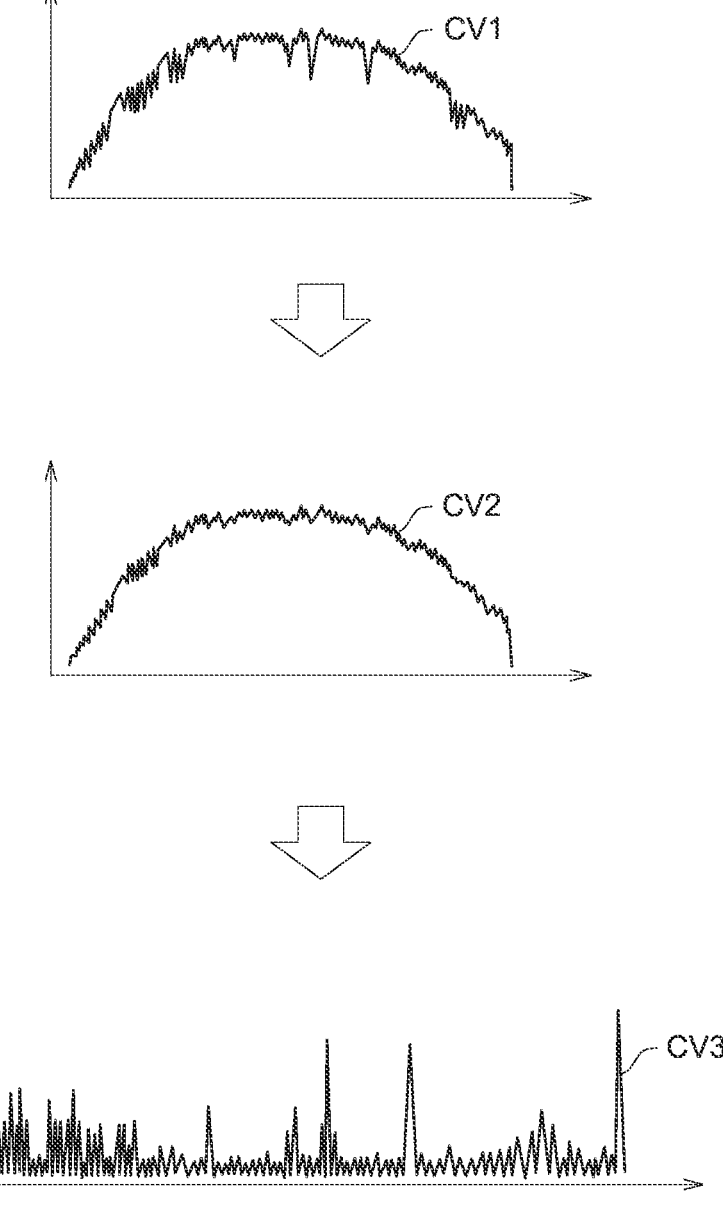
FIG. 6 illustrates the steps S121 and S122.

Next, in the step S120 of FIG. 4A, the surface topography variation analysis unit 120 converts the original surface topography curve CV1 into a surface topography variation curve CV3. The step S120 includes steps S121 and S122. FIG. 6 illustrates steps S121 and S122.

In the step S121, as shown in FIG. 6, the surface topography pretreatment element 121 averages a plurality of points in every unit interval of the original surface topography curve CV1 to obtain a unit interval surface topography curve CV2. The unit interval is, for example, 1 to 10 um, such as 2 um. The measurement precision of the original surface topography curve CV1 is usually finer than 2 um. The original surface topography curve CV1 has several values at every 2 um, and the surface topography pretreatment element 121 averages these values. These averages form the unit interval surface topography curve CV2.

Next, in step S122, as shown in FIG. 6, the surface topography transformation element 122 converts the unit interval surface topography curve CV2 into surface topography variation curve CV3 according to the topography variation of the unit interval surface topography curve CV2. The surface topography variation curve CV3 records the absolute values of the topography changes among the unit intervals. For example, the surface topography transformation element 122 converts the unit interval surface topography curve CV2 into the surface topography variation curve CV3 by using the following formula (1). $tp_j$ is the j-th point of the unit interval surface topography curve CV2, $tp_{j-1}$ is the (j−1)-th point of the unit interval surface topography curve CV2, $tp_{j+1}$ is the (j+1)-th point of the unit interval surface topography curve CV2, $TG_j$ is the j th point of the surface topography variation curve CV3.

$$TG_j = \text{Max}(|tp_j - tp_{j-1}|, |tp_j - tp_{j+1}|) \qquad (1)$$

As shown in FIG. 6, there is an offset difference between the edge and the center of the unit interval surface topography curve CV2. After the unit interval surface topography curve CV2 is converted into the surface topography variation curve CV3, the offset difference between the edge and the center can be effectively eliminated.

Figure 7:
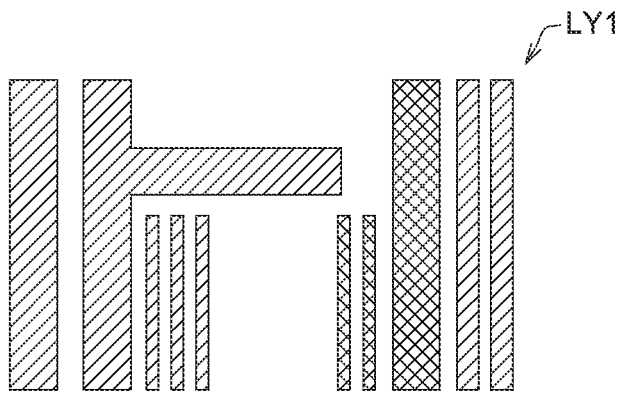
FIG. 7 shows a circuit layout according to an embodiment.

Then, in step S130 of FIG. 4A, the receiving unit 110 receives a circuit layout LY1 of the semiconductor device 800. Please refer to FIG. 7, which shows the circuit layout LY1 according to an embodiment. The circuit layout LY1 is, for example, a two-dimensional layout diagram that describes lines such as signal lines, dummy lines, and interlayer lines.

Figure 8:
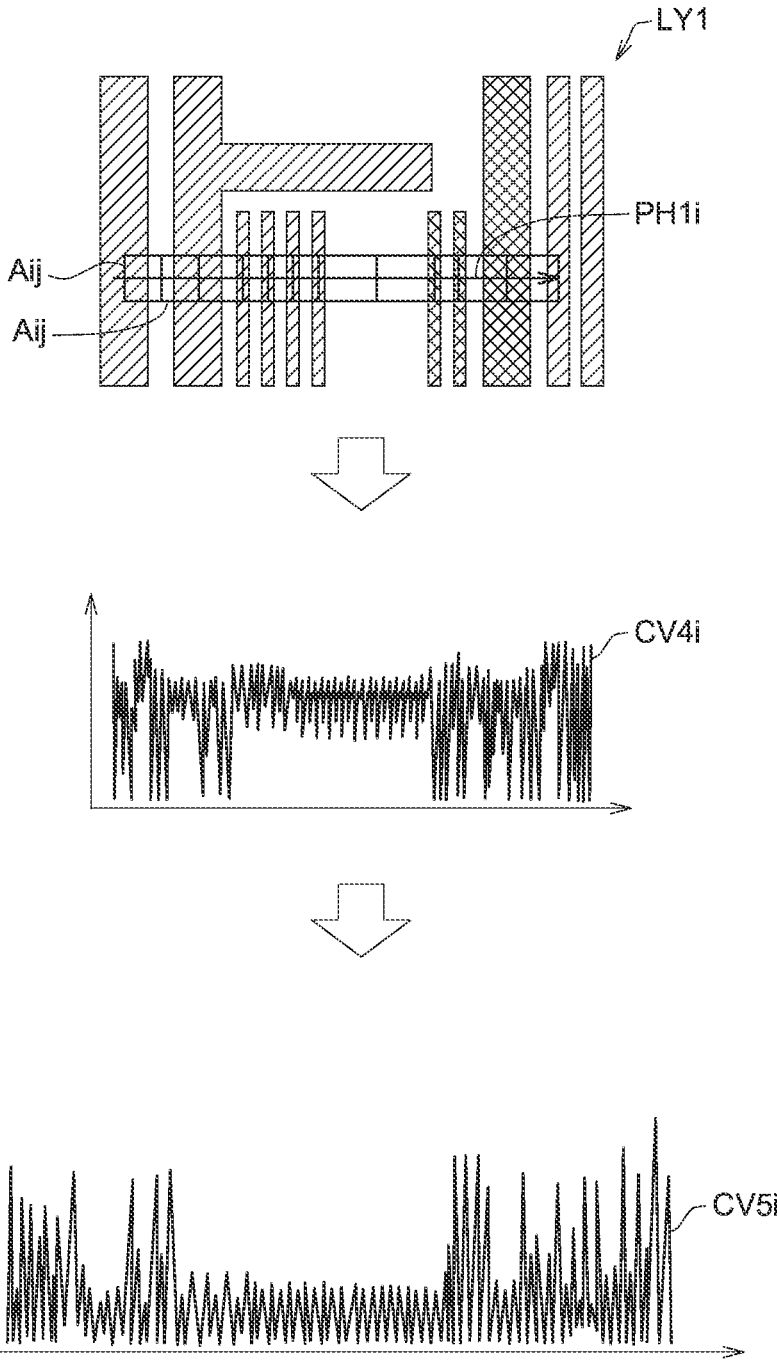
FIG. 8 illustrates the steps S141 and S142.

Next, in step S140 of FIG. 4A, the conductor density variation analysis unit 140 obtains a plurality of conductor density variation curves CV5i along a plurality of layout straight-line paths PH1i on the circuit layout LY1. The step S140, for example, includes steps S141 and S142. FIG. 8 illustrates the steps S141 and S142.

In step S141, as shown in FIG. 8, the conductor density analysis element 141 analyzes the conductor density for each unit area Aij along the layout straight-line paths PH1i on the circuit layout LY1 to obtain a plurality of conductor density per unit area curves CV4i. For example, the unit area Aij is a square whose length and width are 1 um to 10 um, such as 2 um. The conductor density analysis element 141 calculates the proportion value of the conductor in each of the unit areas Aij along the direction of the layout straight-line paths PH1i, and these proportion values form the conductor density per unit area curves CV4i.

Next, in step S142, as shown in FIG. 8, the conductor density conversion element 142 converts each of the conductor density per unit area curves CV4i into one conductor density variation curve CV5i according to the density variation of each of the conductor density per unit area curves CV4i. The conductor density variation curve CV5i records the absolute values of the conductor density changes among the unit areas Aij. For example, the conductor density conversion element 142 converts the conductor density per unit area curve CV4i into the conductor density variation curve CV5i by using the following formula (2). $dt_{ij}$ is the j-th point of the conductor density per unit area curve CV4i, $dt_{i(j-1)}$ is the (j−1)-th point of the conductor density per unit area curve CV4i, $dt_{i(j+1)}$ is the (j+1)-th point of the conductor density per unit area curve CV4i, $DG_{ij}$ is the j-th point of the conductor density variation curve CV5i.

$$DG_{ij} = \text{Max}(|dt_{ij} - dt_{i(j-1)}|, |dt_{ij} - dt_{i(j+1)}|) \qquad (2)$$

As shown in FIG. 8, the changes of the conductor density per unit area curve CV4i can be reflected in the conductor density variation curve CV5i.

The surface topography variation curve CV3 shows the topography variation, and the conductor density variation curve CV5i shows the density variation. If the corresponding positions of that two can be matched, there should be a high correlation.

Then, in step S150 of FIG. 4B, the weighted correlation analysis unit 150 analyzes the weighted correlation RSi between the surface topography variation curve CV3 and each of the conductor density variation curves CV51 according to the weighted values Wk of a plurality of topography variation observation intervals SBk of the surface topography variation curve CV3.

Figure 9:
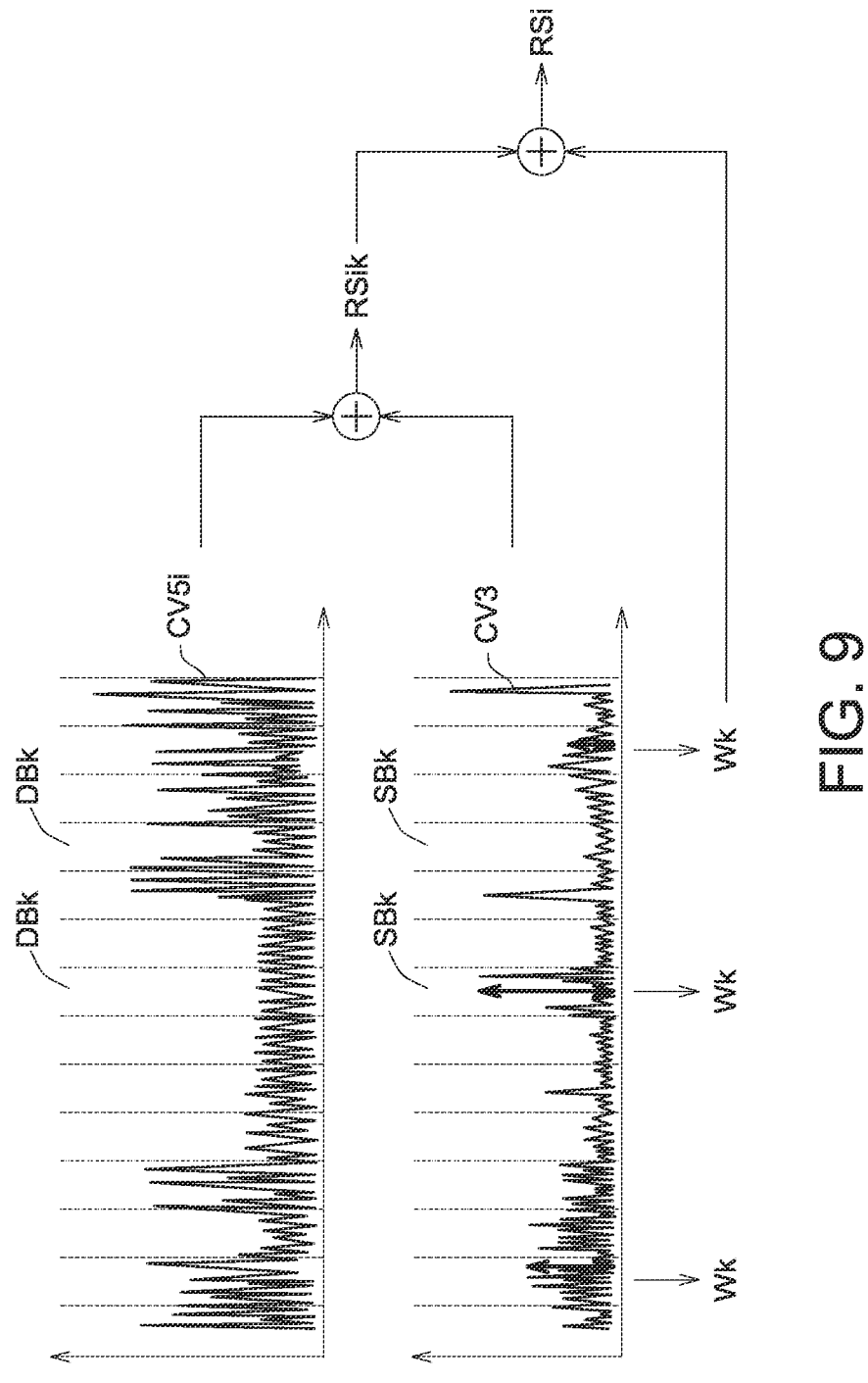
FIG. 9 illustrates the steps S151 to S155.

The step S150, for example, includes steps S151 to S155. FIG. 9 illustrates the steps S151 to S155.

In the step S151, as shown in FIG. 9, the dividing element 151 divides the surface topography variation curve CV3 into a plurality of topography variation observation intervals SBk. The length of each of the topography variation observation intervals SBk is ¹⁄₁₀ to ¹⁄₂₀ of each of the layout straight-line paths PH1i, for example, 300 um.

Next, in the step S152, as shown in FIG. 9, the weight analysis element 152 obtains the weighted values Wk according to the topography amplitudes of the topography variation observation intervals SBk. Each of the weighted values Wk is proportional to each of the topography amplitudes. When the topography amplitude is larger, it can show the characteristics of the topography, so the weighted value Wk will be set larger. When the topography amplitude is small, it is difficult to present the characteristics of the topography, so the weighted value Wk will be set smaller.

Each of the topography amplitudes is a difference between a first percentile value and a second percentile value. The first percentile value is, for example, selected from the value at the 90-th to 97-th percentile, and the second percentile value is, for example, selected from the value at the 2-th to 10-th percentile. For example, the weight analysis element 152 may use the difference between the 95th percentile value and the 5th percentile value as the topography amplitude. Extreme values are excluded to improve representativeness of the topography amplitudes.

Then, in the step S153, as shown in FIG. 9, the dividing element 151 divides each of the conductor density variation curves CV5i into a plurality of density variation observation intervals DBk. The length of each of the density variation observation intervals DBk is ¹⁄₁₀ to ¹⁄₂₀ of each of the layout straight-line paths PH1i, for example, 300 μm. The length of each of the topography variation observation intervals SBk is substantially identical to the length of each of the density variation observation intervals DBk.

Next, in step S154, as shown in FIG. 9, the correlation analysis element 154 analyzes a correlation RSik between the topography variation observation intervals SBk of the surface topography variation curve CV3 and the density variation observation intervals DBk of each of the conductor density variation curves CV5i.

Then, in the step S155, as shown in FIG. 9, the weighting element 155 sums up the correlations RSik between the surface topography variation curve CV3 and each of the conductor density variation curves CV5i according to the weighted values Wk, so as to obtain a weighted correlation RSi.

Figure 10:
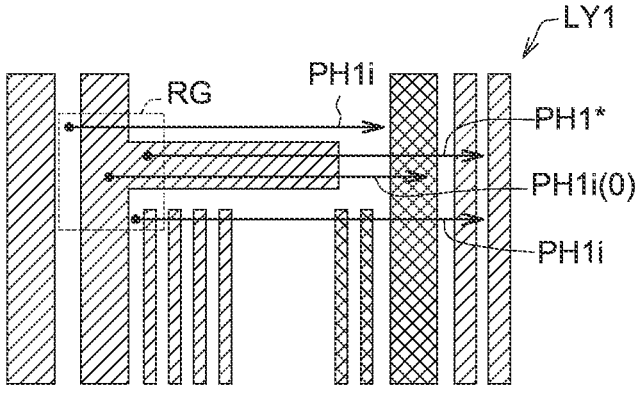
FIG. 10 illustrates the step S160.

In the step S160, the fitting unit 160 obtains the measurement straight line path PH1\* matching the original surface topography curve CV1 from the layout straight-line paths PH1i according to the weighted correlations RSi. Please refer to FIG. 10, which illustrates the step S160. As shown in FIG. 10, the fitting unit 160 searches for a range RG centered on the initially set layout straight-line path PH1i(0). The range RG is, for example, 300 um\*300 um. For each of the layout straight-line paths PH1i in the range RG, one weighted correlation RSi can be obtained according to the above steps S110 to S150. The one with the highest weighted correlation RSi can be regarded as the suitable measurement straight line path PH1\*.

According to the above-mentioned embodiment, the original surface topography curve CV1 of the semiconductor topography measurement and the layout straight-line paths PH1$i$ on the circuit layout LY1 are properly processed, so that the original surface topography curve CV1 can be matched with the measurement straight line path PH1* from the layout straight-line paths PH1$i$. It does not need to spend too much time on calibration and can be used to confirm the accuracy of circuit patterning or to train the product yield prediction model and the defect prediction model.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A matching method implemented in an Atomic Force Microscope (AFM) semiconductor topography measurement system, for matching a surface topography detected from a semiconductor device with a circuit layout of the semiconductor device, to accurately determine a measurement straight line path in the circuit layout used by the AFM during actual scanning, the matching method comprising:

obtaining an original surface topography curve measured by the AFM along the measurement straight line path of the semiconductor device;

converting the original surface topography curve into a surface topography variation curve;

obtaining the circuit layout of the semiconductor device;

generating a plurality of conductor density variation curves along a plurality of layout straight-line paths on the circuit layout;

analyzing a weighted correlation between the surface topography variation curve and each of the conductor density variation curves according to a plurality of weighted values respectively corresponding to a plurality of topography variation observation intervals of the surface topography variation curve; and selecting the measurement straight line path matching the original surface topography curve from among the layout straight-line paths according to the weighted correlations, whereby alignment accuracy between a measurement data of the AFM and the circuit layout is improved for circuit pattern verification and process control.

2. The matching method for semiconductor topography measurement according to claim 1, wherein the original surface topography curve is obtained by using an Atomic Force Microscope (AFM).

3. The matching method for semiconductor topography measurement according to claim 1, wherein the step of converting the original surface topography curve into the surface topography variation curve includes:

averaging a plurality of points in every unit interval of the original surface topography curve to obtain a unit interval surface topography curve; and converting the unit interval surface topography curve into the surface topography variation curve according to a shape variation of the unit interval surface topography curve.

4. The matching method for semiconductor topography measurement according to claim 3, wherein the surface topography variation curve records absolute values of topography changes among the unit intervals.

5. The matching method for semiconductor topography measurement according to claim 1, wherein the step of obtaining the conductor density variation curves along the layout straight-line paths on the circuit layout includes:

analyzing conductor density for each unit area along the layout straight-line paths on the circuit layout to obtain a plurality of conductor density per unit area curves; and converting the conductor density per unit area curves into the conductor density variation curves according to density variation of the conductor density per unit area curves.

6. The matching method for semiconductor topography measurement according to claim 5, wherein the conductor density variation curve records absolute values of conductor density changes among the unit areas.

7. The matching method for semiconductor topography measurement according to claim 1, wherein the step of analyzing the weighted correlation between the surface topography variation curve and each of the conductor density variation curves according to the weighted values of the topography variation observation intervals of the surface topography variation curve includes:

dividing the surface topography variation curve into the topography variation observation intervals;

obtaining the weighted values according to topography amplitudes of the topography variation observation intervals;

dividing each of the conductor density variation curves into a plurality of density variation observation intervals;

analyzing a correlation between the topography variation observation intervals of the surface topography variation curve and the density variation observation intervals of each of the conductor density variation curves; and summing up the correlations between the surface topography variation curve and each of the conductor density variation curves according to the weighted values to obtain the weighted correlation.

8. The matching method for semiconductor topography measurement according to claim 7, wherein a length of each of the topography variation observation intervals is substantially identical to a length of each of the density variation observation intervals.

9. The matching method for semiconductor topography measurement according to claim 7, wherein each of the weighted values is proportional to each of the topography amplitudes.

10. The matching method for semiconductor topography measurement according to claim 7, wherein each of the topography amplitudes is a difference between a first percentile value and a second percentile value.

11. A processing device implemented in an Atomic Force Microscope (AFM) semiconductor topography measurement system, for matching a surface topography detected from a semiconductor device with a circuit layout of the semiconductor device, to accurately determine a measurement straight line path in the circuit layout used by the AFM during actual scanning, the processing device comprising:

a receiving unit, configured to receive an original surface topography curve and the circuit layout of the semiconductor device, wherein the original surface topography curve is measured by the AFM along the measurement straight line path of the semiconductor device;

a surface topography variation analysis unit, configured to convert the original surface topography curve into a surface topography variation curve;

a conductor density variation analysis unit, configured to generate a plurality of conductor density variation curves along a plurality of layout straight-line paths on the circuit layout;

a weighted correlation analysis unit, configured to analyze a weighted correlation between the surface topography variation curve and each of the conductor density variation curves according to a plurality of weighted values respectively corresponding to a plurality of topography variation observation intervals of the surface topography variation curve; and a fitting unit, configured to select the measurement straight line path matching the original surface topography curve from among the layout straight-line paths according to the weighted correlations, whereby alignment accuracy between a measurement data of the AFM and the circuit layout is improved for circuit pattern verification and process control.

12. The processing device according to claim 11, wherein the receiving unit obtains the original surface topography curve by using an Atomic Force Microscope (AFM).

13. The processing device according to claim 11, wherein the surface topography variation analysis unit includes:

a surface topography pretreatment element, configured to average a plurality of points in every unit interval of the original surface topography curve to obtain a unit interval surface topography curve; and a surface topography transformation element, configured to convert the unit interval surface topography curve into the surface topography variation curve according to a shape variation of the unit interval surface topography curve.

14. The processing device according to claim 13, wherein the surface topography variation curve records absolute values of topography changes among the unit intervals.

15. The processing device according to claim 11, wherein the conductor density variation analysis unit includes:

a conductor density analysis element, configured to analyze conductor density for each unit area along the layout straight-line paths on the circuit layout to obtain a plurality of conductor density per unit area curves; and a conductor density conversion element, configured to convert the conductor density per unit area curves into the conductor density variation curves according to density variation of the conductor density per unit area curves.

16. The processing device according to claim 15, wherein the conductor density variation curve records absolute values of conductor density changes among the unit areas.

17. The processing device according to claim 11, wherein the weighted correlation analysis unit includes:

a dividing element, configured to divide the surface topography variation curve into the topography variation observation intervals and divide each of the conductor density variation curves into a plurality of density variation observation intervals;

a weight analysis element, configured to obtain the weighted values according to topography amplitudes of the topography variation observation intervals;

a correlation analysis element, configured to analyze a correlation between the topography variation observation intervals of the surface topography variation curve and the density variation observation intervals of each of the conductor density variation curves; and a weighting element, configured to sum up the correlations between the surface topography variation curve and each of the conductor density variation curves according to the weighted values to obtain the weighted correlation.

18. The processing device according to claim 17, wherein a length of each of the topography variation observation intervals is substantially identical to a length of each of the density variation observation intervals.

19. The processing device according to claim 17, wherein each of the weighted values is proportional to each of the topography amplitudes.

20. The processing device according to claim 17, wherein each of the topography amplitudes is a difference between a first percentile value and a second percentile value.

* * * * *